US008243501B2

(12) United States Patent
Ouchi et al.

(10) Patent No.: US 8,243,501 B2
(45) Date of Patent: Aug. 14, 2012

(54) SRAM DEVICE

(75) Inventors: Shinichi Ouchi, Tsukuba (JP);
Meishoku Masahara, Tokyo (JP)

(73) Assignee: National Institute of Advanced Industrial Science and Technology (JP)

( * ) Notice: Subject to any disclaimer, the term of this patent is extended or adjusted under 35 U.S.C. 154(b) by 0 days.

(21) Appl. No.: 13/295,398

(22) Filed: Nov. 14, 2011

(65) Prior Publication Data

US 2012/0057398 A1 Mar. 8, 2012

Related U.S. Application Data

(63) Continuation of application No. 12/531,780, filed as application No. PCT/JP2008/054720 on Mar. 14, 2008.

(30) Foreign Application Priority Data

Mar. 20, 2007 (JP) ................................ 2007-072903

(51) Int. Cl.
*G11C 11/00* (2006.01)
*H01L 27/088* (2006.01)
(52) U.S. Cl. ....................................... 365/156; 257/401
(58) Field of Classification Search .................. 365/156; 257/401
See application file for complete search history.

(56) References Cited

U.S. PATENT DOCUMENTS

| 7,400,525 | B1 * | 7/2008 | Kim | 365/156 |
|---|---|---|---|---|
| 7,408,800 | B1 * | 8/2008 | Braceras et al. | 365/154 |
| 7,511,989 | B2 | 3/2009 | Thomas et al. | 365/154 |
| 7,522,445 | B2 * | 4/2009 | Inaba | 365/154 |
| 7,710,765 | B2 * | 5/2010 | Hanafi | 365/156 |
| 2005/0248986 | A1 | 11/2005 | Wong | 365/185.22 |
| 2006/0068531 | A1 | 3/2006 | Breitwisch et al. | 438/149 |
| 2006/0274569 | A1 * | 12/2006 | Joshi et al. | 365/154 |
| 2007/0183185 | A1 * | 8/2007 | Guo et al. | 365/156 |
| 2007/0189060 | A1 * | 8/2007 | Inaba | 365/154 |
| 2008/0186752 | A1 | 8/2008 | Kim | 365/63 |

FOREIGN PATENT DOCUMENTS

| JP | 2005-167163 A | 6/2005 |
|---|---|---|
| JP | 2005-174960 A | 6/2005 |
| JP | 2005-260607 A | 9/2005 |
| JP | 2007-103629 A | 4/2007 |
| JP | 2007-201107 A | 8/2007 |

OTHER PUBLICATIONS

International Search Report dated Apr. 15, 2008, issued in corresponding International Application No. PCT/JP2008/054720.
M. Masahara et al. "Demonstration of Asymmetric Gate-Oxide Thickness Four-Terminal FinFETs Having Flexible Threshold Voltage and Good Subthreshold Slope", *IEEE Electron Device Letters*, 28(3):217-219 (2007).

* cited by examiner

*Primary Examiner* — Hoai V Ho
*Assistant Examiner* — Min Huang
(74) *Attorney, Agent, or Firm* — Ostrolenk Faber LLP

(57) ABSTRACT

An SRAM device uses a four-terminal double gate field effect transistor as a selection transistor, wherein the four-terminal double gate field effect transistor comprises a gate which drives the transistor and a gate which controls a threshold voltage, which are electrically separated from each other, on both surfaces of a standing semiconductor thin plate, and wherein a voltage used to reduce a threshold voltage is input to the gate which controls the threshold voltage of the selection transistor during a writing operation than during a reading operation. The SRAM device which can increase both the read and write margins is provided.

13 Claims, 9 Drawing Sheets

SRAM DEVICE

CROSS REFERENCE TO RELATED APPLICATIONS

The present application is a continuation under 37 C.F.R. §1.53(b) of prior application Ser. No. 12/531,780, filed Sep. 17, 2009, by Shinichi Ouchi et al. entitled SRAM DEVICE, which is a U.S.C. §371 National Phase conversion of PCT/JP2008/054720, filed Mar. 14, 2008, which claims priority of Japanese Application No. 2007-072903, filed Mar. 20, 2007, the entire contents of which are specifically incorporated by reference. The PCT International Application was published in the Japanese language.

TECHNICAL FIELD

The present invention relates to a static random access memory (SRAM) device.

BACKGROUND ART

Today, in conventional SRAM devices, 6-transistor CMOS SRAM cells are configured using planar MOS field effect transistors.

However, miniaturization of the device dimensions, which is performed with the aim of performance improvement such as integration density and operation speed, increases variation in the characteristics of the device. The variation obviously affects the operation stability of the SRAM. That is, the performances of the respective devices deviate randomly from the design target, so that mismatch occurs and bistability, which is indispensable for memory retention, is degraded. The variation in the device characteristics may eventually lead to malfunction, so that the yield will be lowered in the production process and reliability of the information systems will be lowered.

As an index for evaluating bistability, noise margin can be employed. The noise margin is defined as the maximum voltage of the noise amplitude which is allowed to be superposed on memory nodes. The noise margin for a read operation, a read margin, is the most difficult to ensure sufficiently among read, write and hold operations. The above-mentioned mismatch between the devices reduces the read margin. Therefore, when the SRAM device is designed, the noise margin is designed in advance so as to be large, so that it is possible to have a large margin even when there are variations in the device's characteristics in the production process.

The read margin cannot be increased without limit by device design, but it is inextricably linked with another index called a write margin. The write margin is defined as the maximum voltage amplitude which is allowed to be superposed on memory nodes when a write operation is performed, or the maximum voltage amplitude which is allowed to be superposed on word lines. When a circuit is designed such that the read margin increases, the write margin decreases.

In a conventional 6-transistor SRAM device, there are a few methods to enhance both the read and write margins. This was because the transistor's characteristics are fixed and it was difficult to change the transistor's characteristics according to the read or write operations.

For example, in Patent Document 1, there is disclosed an SRAM cell which uses double gate field effect transistors. The variation can be reduced to more than that of the known planar CMOS. Still, there was a problem with the performance variation of the double gate field effect transistors, and no method has been provided which increases both the read margin and the write margin.

In addition, in Patent Document 2, there is disclosed an SRAM device which uses four-terminal double gate field effect transistors of which two gates of the double gate field effect transistor are separated from each other. However, the SRAM device is configured to reduce the leakage current. This circuit is too complicated as a circuit for increasing both the read and the write margins at the same time. In addition, in Patent Document 2, there is no disclosure of the operation method or the peripheral devices for increasing both the read and the write margins.

Patent Document 1: Specification of US Patent Application Laid-Open Publication No. 2006-068531
Patent Document 2: JP-A-2005-260607

DISCLOSURE OF INVENTION

Problem to be Solved by the Invention

The present invention has been made to address the above-mentioned problems, and an object is to provide an SRAM device which can increase both the read and write margins.

Means for Solving the Problems

The above-mentioned problems will be solved by the following means.

(1) An SRAM device using a four-terminal double gate field effect transistor as a selection transistor, wherein the four-terminal double gate field effect transistor comprises a gate which drives the transistor and a gate which controls a threshold voltage, which are electrically separated from each other, on both surfaces of a standing semiconductor thin plate, and wherein a voltage used to reduce a threshold voltage is input to the gate which controls the threshold voltage of the selection transistor during a writing operation than during a reading operation.

(2) The SRAM device according to (1), wherein the gate which controls the threshold voltage of the selection transistor is connected to wires arranged in a column direction parallel with a bit line.

(3) The SRAM device according to (1) or (2), further comprising, on each column, a circuit which calculates the logical product of a write enable signal and a column selection signal which is output from a column decoder, and generates a bias voltage according to the result.

(4) The SRAM device according to any one of (1) to (3), wherein a signal potential of a word line is adjusted so as to reduce current leakage which flows through a bit line in a cell belonging to a row without being selected.

(5) The SRAM device according to (4), further comprising, on each row, a circuit which determines the signal potential suitable to an operation of a corresponding row on the basis of a row selection signal of a row decoder, and outputs the signal potential to a word line.

Effect of the Invention

According to this invention, the SRAM device which can increase both the read and write margins can be obtained. That is, according to the invention, unlike the SRAM device according to the related art, the conductance of a selection transistor can be increased in a SRAM cell during a writing operation, and decreased in the SRAM cell during a reading operation. As a result, it is possible to increase both the read and write margins at the same time. In addition, according to the invention as described in claim 4, it is possible to prevent an increase in current leakage in the selection transistors.

REFERENCE SYMBOLS

100: SILICON ON INSULATOR (SOI) LAYER OF AN SOI WAFER WHICH IS FORMED INTO A STANDING SEMICONDUCTOR THIN PLATE
  200: n-CHANNEL FIELD EFFECT TRANSISTOR
  205: p-CHANNEL FIELD EFFECT TRANSISTOR
  300: SRAM CELL
  401: LEVEL SHIFTER
  402: CIRCUIT BLOCK COMPRISING ROW DECODERS, AND LATCHES OR REGISTERS
  403: CIRCUIT BLOCK COMPRISING COLUMN DECODERS, AND LATCHES OR REGISTERS
  701: CMOS INVERTER WHICH SUPPLIES BIAS VOLTAGE WHICH CONTROLS THRESHOLD VOLTAGE TO AN SRAM CELL INSTEAD OF 401
  1100: SRAM CELL WHICH USES FOUR-TERMINAL DOUBLE GATE p-CHANNEL FIELD EFFECT TRANSISTOR AS A SELECTION TRANSISTOR
  1201: LEVEL SHIFTER FOR DRIVING 1100
  WL: WORD LINE AND SIGNAL THEREOF
  BL, BL~: BIT LINE
  $V_{G2}$: BIAS VOLTAGE SUPPLYING LINE WHICH CONTROLS THRESHOLD VOLTAGE AND SIGNAL THEREOF
  $V_{G2,0}$, $V_{G2,1}$: LOW LEVEL POTENTIAL AND HIGH LEVEL POTENTIAL OF BIAS VOLTAGE SIGNAL WHICH CONTROLS THRESHOLD VOLTAGE
  MC: MEMORY CELL 300 OR 1100
  PC: PRE-CHARGE CIRCUIT
  PCE: OUTPUT SIGNAL OF PRE-CHARGE CIRCUIT
  SEL: SELECTOR CIRCUIT
  Read/Write: READING-WRITING CIRCUIT BLOCK
  WE, WE~: WRITE ENABLE SIGNAL AND NEGATIVE LOGICAL SIGNAL THEREOF

BEST MODE FOR CARRYING OUT THE INVENTION

Figure 1:
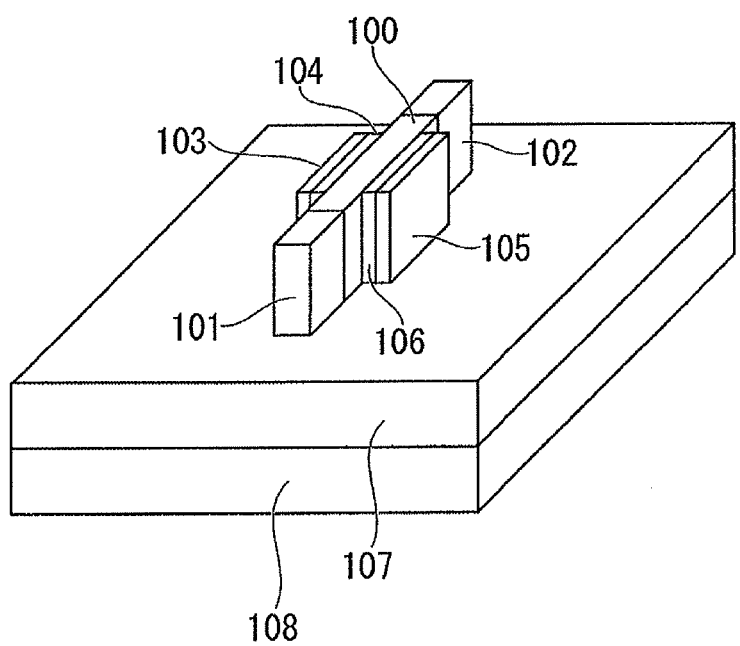
FIG. 1 is a figure schematically illustrating a configuration of a four-terminal double gate field effect transistor.

FIG. 1 is a figure schematically illustrating a device structure of a four-terminal double gate field effect transistor which constitutes an SRAM cell. Reference numeral 100 in FIG. 1 represents a Silicon On Insulator (SOI) layer of an SOI wafer which is formed into a standing semiconductor thin plate. Reference numerals 101 and 102 represent a source electrode and a drain electrode which are highly doped with an impurity. Reference numerals 103 and 104 represent a first gate electrode and a gate insulating film. Reference numerals 105 and 106 represent a second gate electrode and a gate oxide film. Reference numeral 107 is a buried oxied (BOX) layer. Reference numeral 108 represents a semiconductor substrate layer. The first gate electrode and the second gate electrode are electrically separated and placed on opposite surfaces of a fine semiconductor thin plate which is standing.

Further, it is known that a device formed from the bulk wafer, without an SOI structure, realizes the same function as that of the device shown in FIG. 1, where 104 and 108 are formed from the identical silicon layer and 107 is deposited. Therefore, the invention can be similarly applied on a device which is created from such a bulk wafer.

When the first gate electrode 103 of the four-terminal double gate field effect transistor is used as a signal input gate and the second gate electrode 105 is used as a bias voltage input gate, a threshold voltage of the transistor as viewed from the signal input gate can be changed by an input voltage of the bias voltage input gate. As a result, a similar effect to the substrate bias effect in a bulk planar MOS can be attained. In this case, unlike the case of the bulk planar MOS, when an integrated circuit is configured with the devices, the threshold voltages of the respective devices can be controlled independently.

Figure 2:
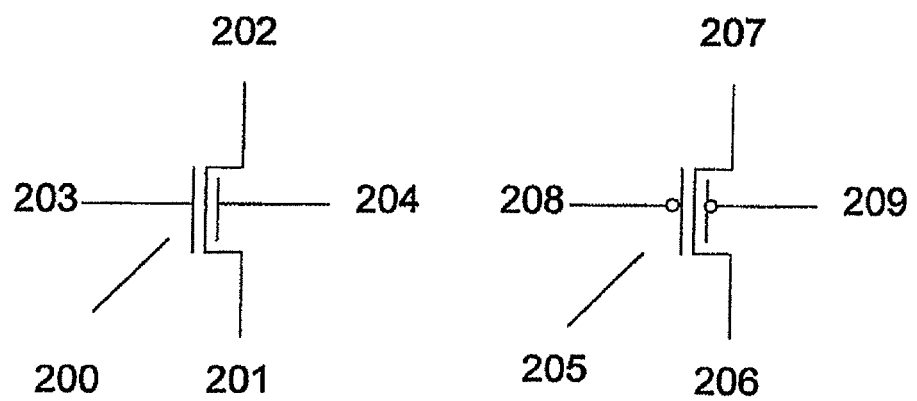
FIG. 2 is a symbol illustrating a four-terminal double gate field effect transistor in a circuit diagram.

FIG. 2 shows symbols of the four-terminal double gate field effect transistor. A device 200 represents an n-channel field effect transistor. A device 205 represents a p-channel field effect transistor. The terminals of the n-channel field effect transistor 200 consist of a source terminal 201, a drain terminal 202, a first gate terminal 203, and a second gate terminal 204. The terminals of the p-channel field effect transistor 205 consist of a source terminal 206, a drain terminal 207, a first gate terminal 208, and a second gate terminal 209.

(First Embodiment)

As described above, the four-terminal double gate field effect transistor is used as the selection transistor. Each transistor constituting flip-flops is configured with a usual double gate field effect transistor of which two gates are connected. As a result, a 6-transistor SRAM cell is configured as shown in FIG. 3.

The terminals of the threshold voltage control gate of the four-terminal double gate field effect transistor, are connected to the wires parallel to bit lines BL and BL~. Here, each MN31 and MN32 is different from the four-terminal double gate field effect transistor, and is a usual n-channel double gate field effect transistor of which two gates are connected to each other. MP31 and MP32 are the general p-channel double gate field effect transistors. In addition, the selection transistors MN33 and MN34 are the four-terminal double gate n-channel field effect transistors.

Figure 3:
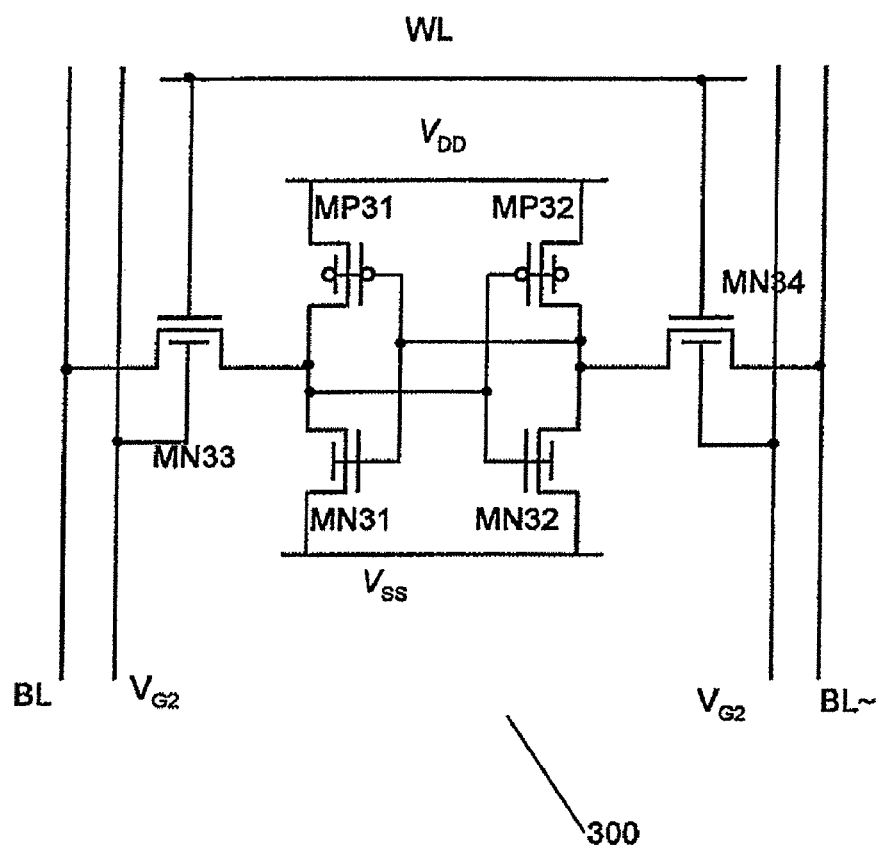
FIG. 3 is a circuit diagram of an SRAM cell which comprises a four-terminal double gate field effect transistor as a selection transistor.
Figure 4:
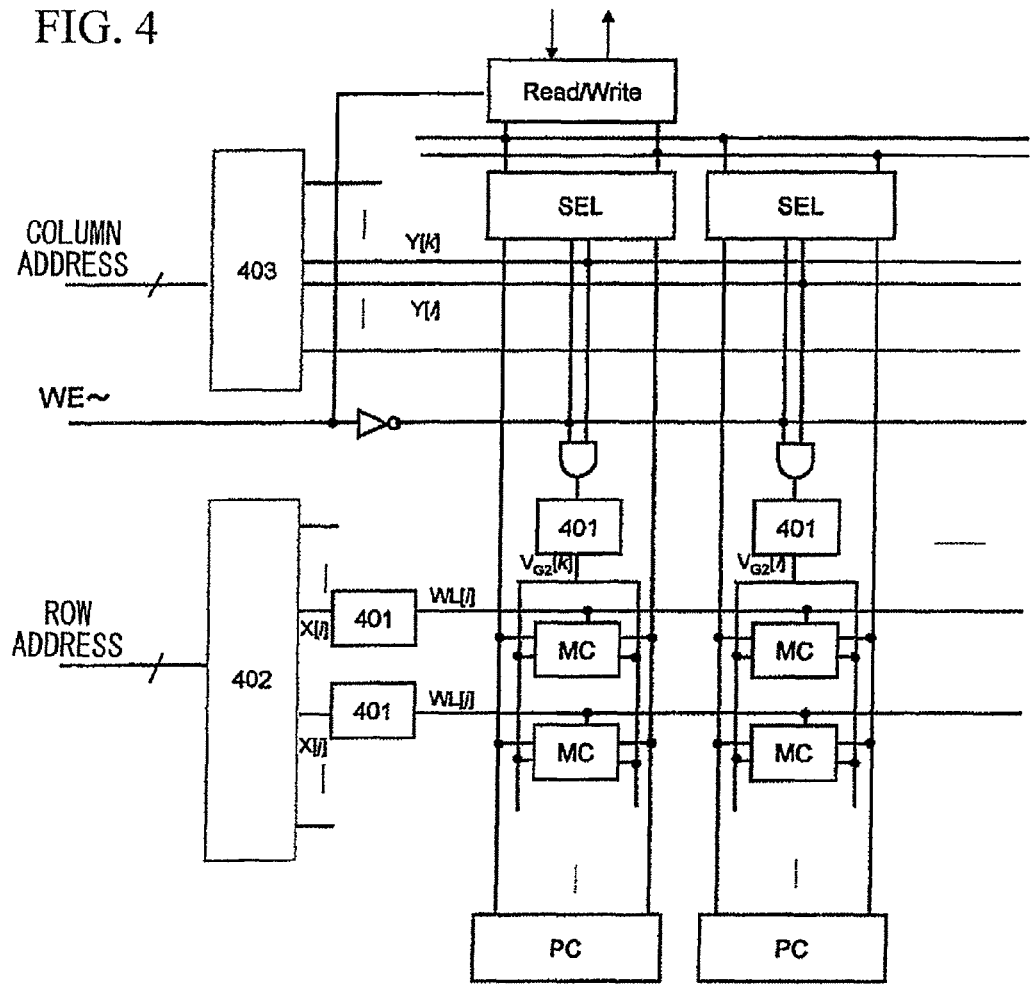
FIG. 4 is a circuit diagram of an SRAM device, in which the SRAM cell shown in FIG. 3 is applied, according to a first embodiment.
Figure 5:
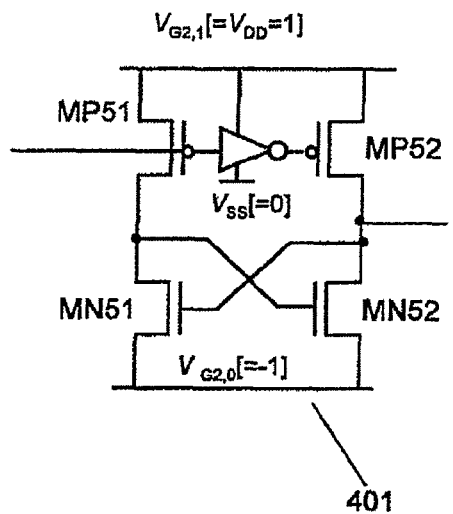
FIG. 5 is a circuit diagram specifically illustrating a level shifter 401 which is applied in the SRAM device shown in FIG. 4.
Figure 6:
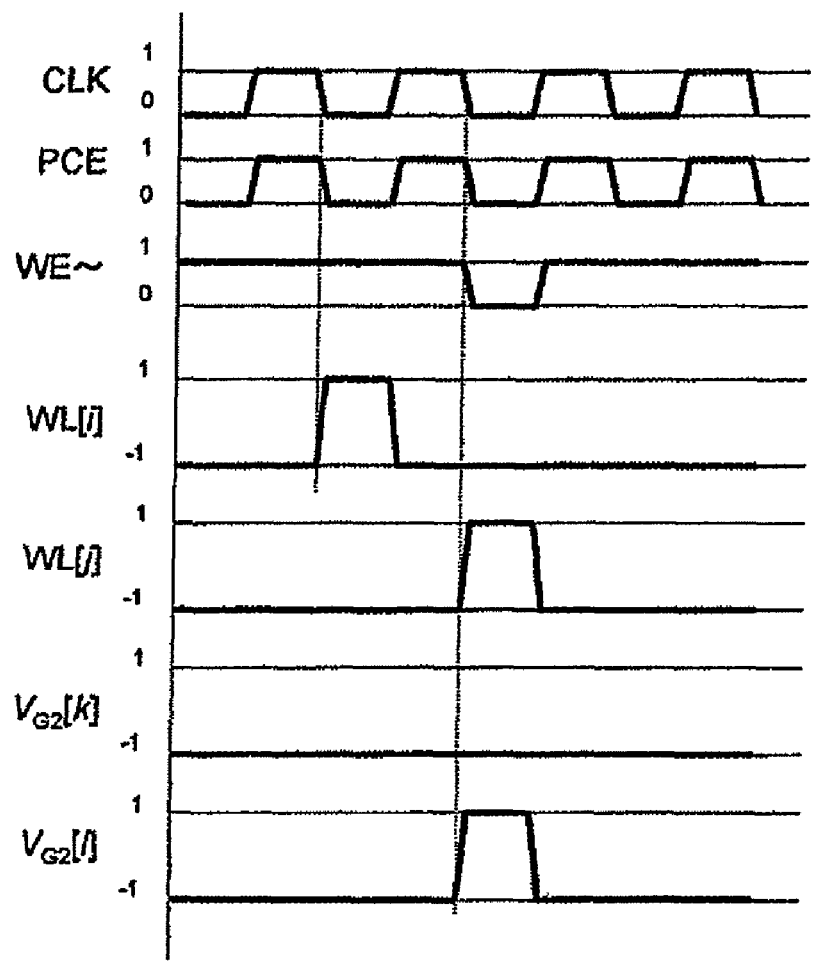
FIG. 6 is a timing chart when the SRAM shown in FIG. 4 operates.

The SRAM cell shown in FIG. 3 is applied in the SRAM device shown in FIG. 4 and signal waveforms shown in FIG. 6 are input. With the configuration, a basic function regarding the optimization of the read and write margins, which is disclosed in the invention, is realized. Here, reference numeral 401 represents a level shifter, and an inner circuit thereof is shown in FIG. 5. In FIG. 5, MN51 and MN52 are the n-channel field effect transistors, and MP51 and MP52 are the p-channel field effect transistors.

In addition, a driver (buffer-amp) may be inserted into the following stage of the level shifter 401 in order to drive interconnection according to a required speed.

Here, reference numerals 402 and 403 respectively represent a circuit block comprising row decoders, and latches or registers and a circuit block comprising column decoders, and latches or registers.

Further, either the usual double gate field effect transistors or the conventional bulk planar MOS field effect transistors are applicable to the field effect transistors MN51, MN52, MP51, MP52, and those constituting 402, and 403.

The SRAM device shown in FIG. 4 operates as described below.

(1) A pre-charge circuit PC inputs a signal PCE to the bit lines BL to BL~ on the basis of a clock signal CLK, and performs pre-charging.

(2) Row addresses and column addresses are respectively decoded by 402 and 403. For example, when an address (i, k) is specified from "M×N" addresses in total, X[i] and a column selection signal Y[k] are raised after the pre-charging operation as shown in FIG. 6.

(3) X[i], and Y[k]·WE which is the logical product of the write enable signal WE and Y[k] are level shifted by the level shifter 401, and the signals WL[i] and $V_{G2}$[k] are generated. In the first embodiment, as one example, the signals X and Y·WE ranging from 0 V to 1 V are converted to the signals ranging from −1 V to 1 V. In an example shown in FIG. 5, the cell, of which address is (i, k), is selected for a read operation, namely WE=0. At this time, $V_{G2}$[k] is −1 V. Since the threshold voltage of the MN33 and MN34 is increased by $V_{G2}$ of −1 V and the conductance thereof is lowered, the read margin is increased.

(4) On the contrary, for example, when the WE turns to 1 and a write operation is executed on the cell (j, l), $V_{G2}$[l] turns to 1 V as shown in FIG. 6. Therefore, since the threshold voltage of the MN33 and MN34 is reduced and the conductance thereof is higher, the write margin is increased.

Here, since the $V_{G2}$ is set to be lower when the reading is performed, all the selection transistors MN33 and MN34 of the unselected cell come to be in a sufficiently strong off state. However, since the $V_{G2}$ comes to be 1 V when the writing is performed, both transistors come to be in a state of $V_{G2}$=1 V at the same time even on unselected rows, the both transistors are almost in the on-state, so that there may be a risk of memory destruction. In order to avoid this, a potential (which as an example corresponds to −1 V in this embodiment) lower than a ground potential of the cell is input to the WL on the unselected rows without being selected, and the strong off state is maintained.

Further, when a power supply voltage is appropriately selected according to the configuration of the device, a low level potential of the $V_{G2}$ or WL is accordingly also appropriately selected.

(Second Embodiment)

Figure 7:
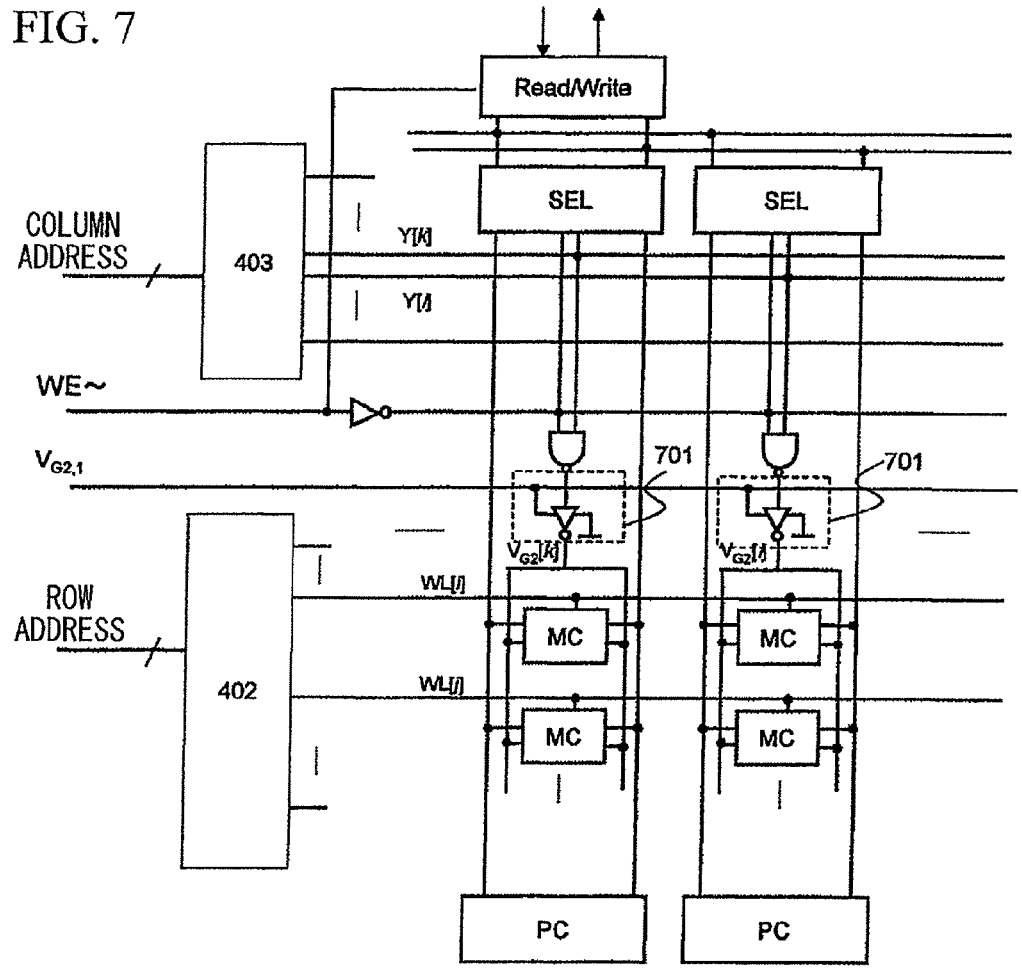
FIG. 7 is a circuit diagram of an SRAM device, in which the SRAM cell shown in FIG. 3 is applied, according to a second embodiment.
Figure 8:
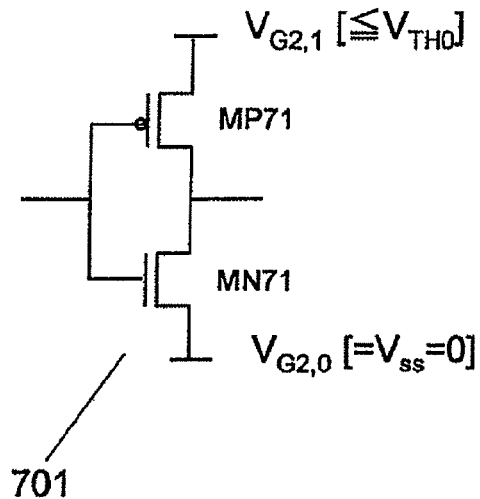
FIG. 8 is a circuit diagram specifically illustrating an inverter 701 which is applied in the SRAM device shown in FIG. 7 and supplies a bias voltage which controls a threshold voltage instead of a level shifter 401.
Figure 9:
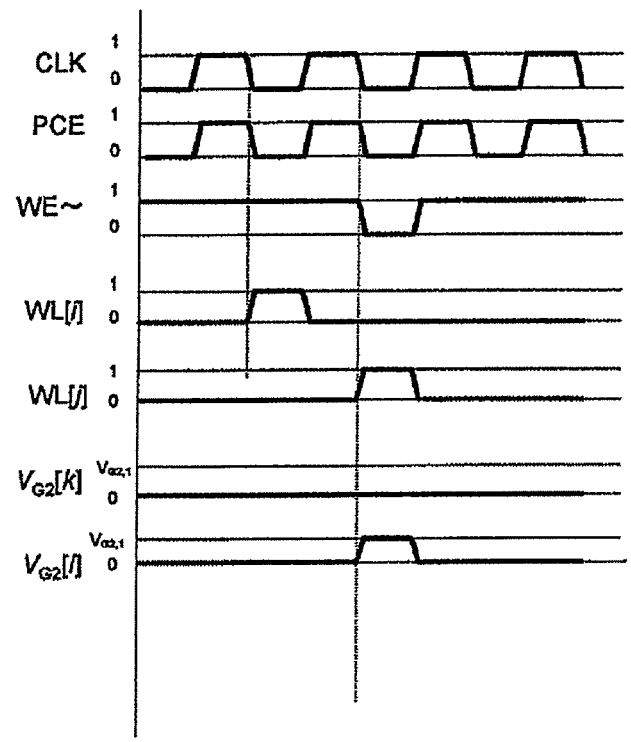
FIG. 9 is a timing chart when the SRAM shown in FIG. 7 operates.

By selecting the capacitance of the gate insulating film and work function of the second gates 204 to 209 of the four-terminal double gate field effect transistor, the signal level, that is, the potential used in the $V_{G2}$ and WL can be changed (refer to JP-A-2005-167163 and JP-A-2005-174960). Using this method appropriately, the invention can be applied even though either or both the $V_{G2}$ and WL is changed in a range of $V_{SS}$ [=0]≦$V_{G2}$≦$V_{DD}$, $V_{SS}$ [=0]≦$V_{WL}$≦$V_{DD}$. Here, the configuration shown in FIG. 4 can be simplified as shown in FIG. 7. That is, the level shifter 401 is omitted from each row, and a CMOS inverter 701 shown in FIG. 8 is inserted instead of the level shifter 401 in each column, so that the same effect as that of the first embodiment can be attained. In FIG. 8, the MN71 is the n-channel field effect transistor, and the MP71 is the p-channel field effect transistor. Either the usual double gate field effect transistors or the conventional bulk planar MOS field effect transistors are applicable to these MN71 and MP 71. As a result, the timing chart shown in FIG. 6 is the same as that shown in FIG. 9.

In this case, the $V_{G2}$ during the writing can be increased in a range as long as the MN33 and MN34 do not turn to the on-state when they are not selected (when $V_{WL}$=0 V). That is, the highest potential allowed for the $V_{G2}$ corresponds to a threshold voltage $V_{TH0}$ of the second gate when the $V_{WL}$=0 V.

(Third Embodiment)

Figure 10:
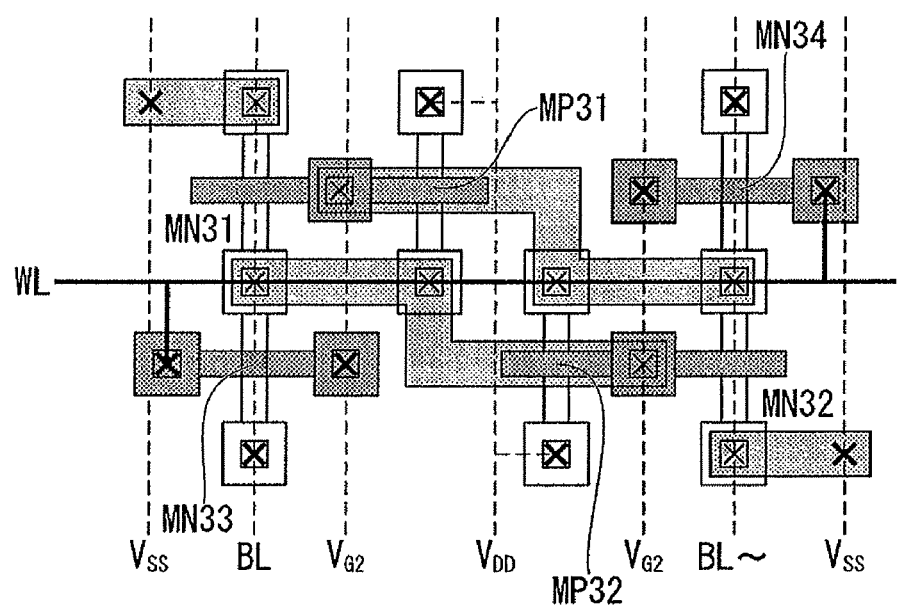
FIG. 10 is a figure illustrating a layout of an SRAM cell which is implemented on a semiconductor substrate.
Figure 11:
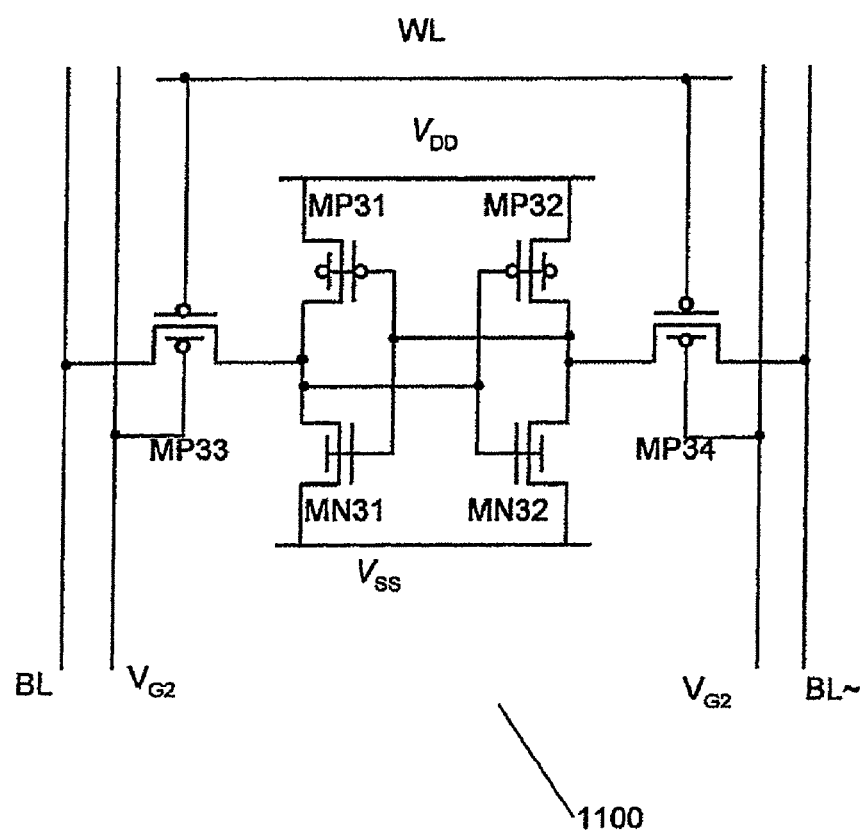
FIG. 11 is a circuit diagram of an SRAM cell which comprises a four-terminal double gate p-channel field effect transistor as a selection transistor.
Figure 12:
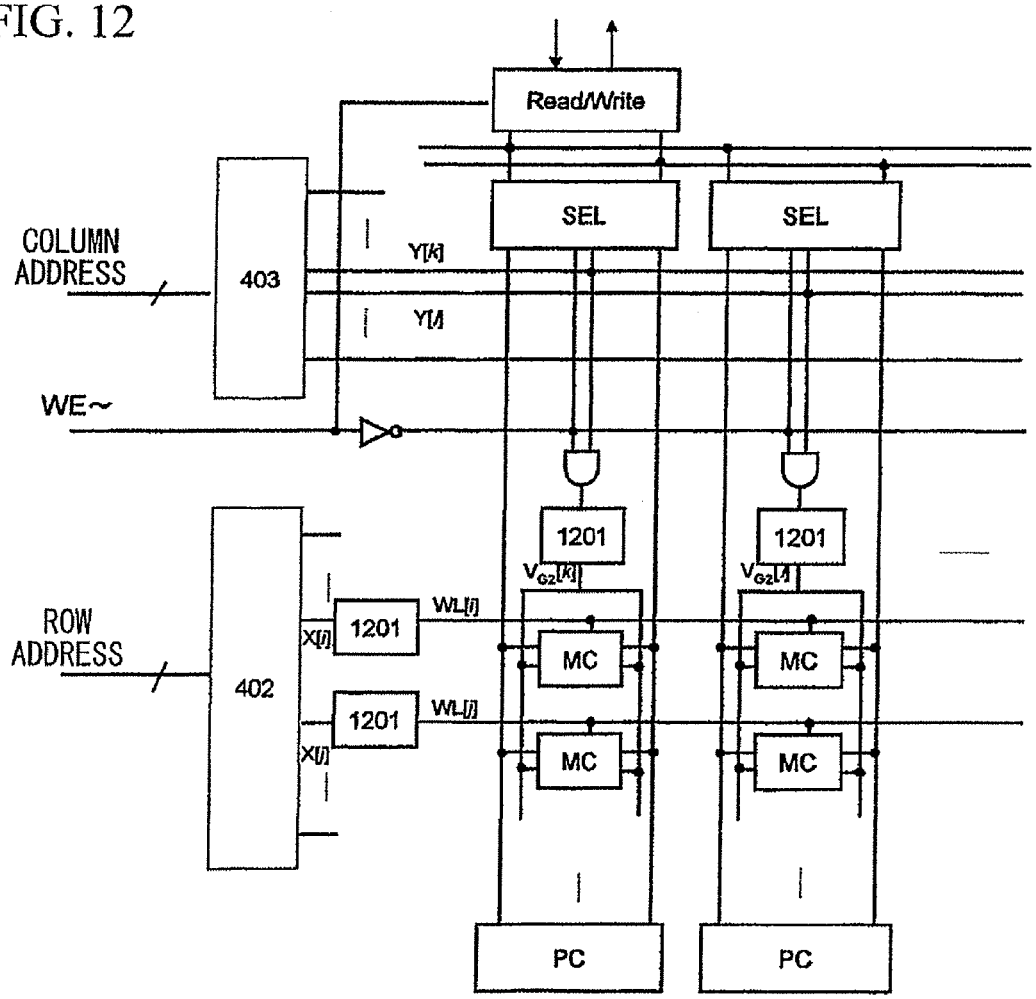
FIG. 12 is a circuit diagram of an SRAM device, in which the SRAM shown in FIG. 11 is applied, according to a fifth embodiment.
Figure 13:
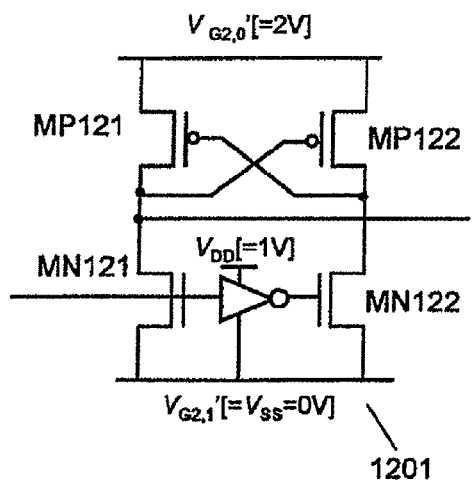
FIG. 13 is a circuit diagram specifically illustrating a level shifter 1201 which is applied in the SRAM shown in FIG. 12.
Figure 14:
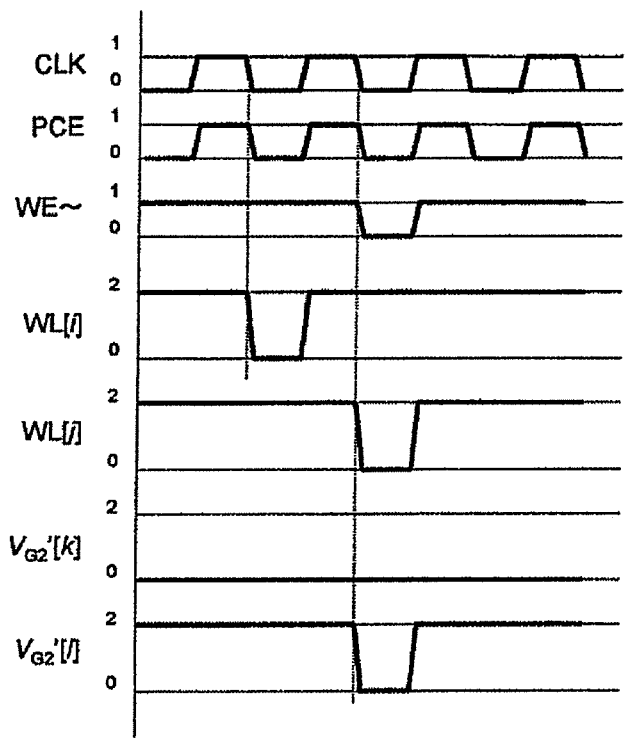
FIG. 14 is a timing chart when the SRAM shown in FIG. 12 operates.

In this embodiment, a layout when a memory cell 300 is implemented on a semiconductor substrate in practice is disclosed. FIG. 10 is a figure illustrating the layout of the SRAM cell which is implemented on the semiconductor substrate. By configuring the four-terminal double gate field effect transistor so as to be symmetrical about a point, the memory cell shown in FIG. 3 is implemented on the semiconductor substrate. Further, in FIG. 10, wires in second and third metal layers are respectively denoted by a solid line and a dotted line so as to be simply displayed. In addition, the symbol x shown in FIG. 10 indicates the positions of contacts or via holes.

(Fourth Embodiment)

There has been known that the second gate oxide film 106 of the four-terminal double gate field effect transistor is formed to be thicker than the first gate oxide film 105, so that the ON-OFF characteristics of the transistor can be improved. (M. Masahara et al. "Demonstration of asymmetric gate-oxide thickness four-terminal Fin FETs having flexible threshold voltage and good subthreshold slope", IEEE Electron Device Letters, vol. 28, no. 3, pp. 217-219, March 2007.)

The knowledge can be also applied to the MN33 and MN34 according to the invention.

(Fifth Embodiment)

In the first to fourth embodiments, the MN33 and the MN34 are configured with the n-channel devices. However, these are configured with p-channel devices MP33 and MP34, so that the system composition can be simplified. The examples of the composition are shown in FIGS. 11 to 15. In FIGS. 11 to 15, the same components as those shown in FIGS. 3 to 10 are denoted by the same reference numerals. Here, $V_{G2,0}'$ and $V_{02,1}'$ respectively correspond to $V_{G2,0}$ and $V_{G2,1}$, and can be respectively realized by a positive voltages greater than 0 V, for example 2 and 0 V respectively. In an integrated circuit, a core containing calculation or storage devices is usually designed to operate at a low voltage such as 0.0 to 1.0 V, and an interface with an external circuit operates at a voltage higher than that of the core such as 0.0 to 3.3 V. In this embodiment, it is possible to use the voltage, which is used in such a peripheral circuit, directly or by reducing its voltage with a regulator. Therefore, a system can be configured without using negative voltage. The level shifter is configured such as 1201. In this case, the operation speed may be adjusted by inserting a driver (buffer-amp) into the following stage of 1201 in order to drive the interconnection.

Figure 15:
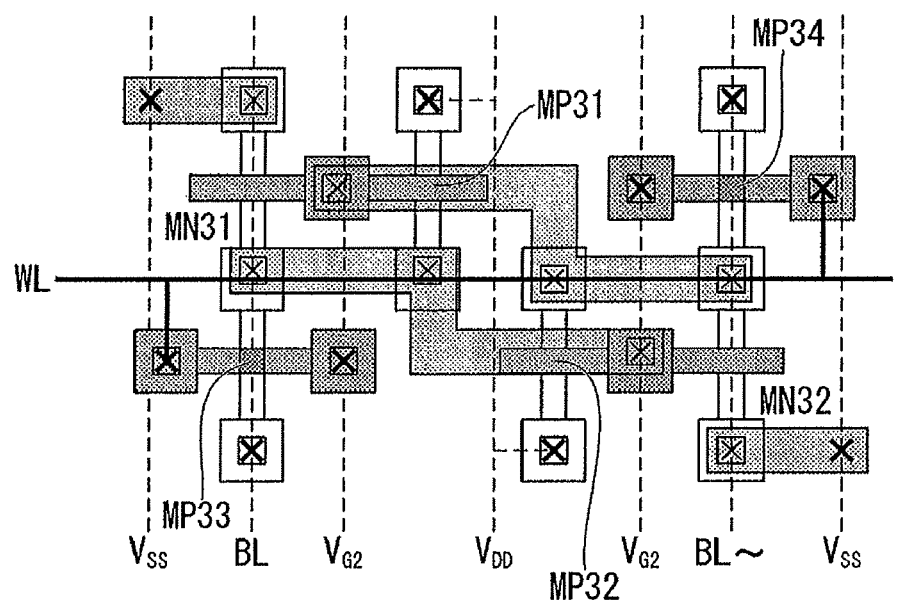
FIG. 15 is a figure illustrating a layout of an SRAM cell which is implemented on a semiconductor substrate.

The layout can be realized in a structure shown in FIG. 15 because this is implemented by using semiconductor thin plate structures, unlike the bulk planar MOS. Further, in FIG. 15, wires in second and third metal layers are respectively denoted by a solid line and a dotted line so as to be simply displayed. In addition, the symbol x shown in FIG. 15 indicates the positions of contacts or via holes.

What is claimed is:

1. An SRAM device using a four-terminal double gate field effect transistor as a selection transistor,
wherein the four-terminal double gate field effect transistor comprises a gate which drives the transistor and a gate which controls a threshold voltage, which are electrically separated from each other, on both surfaces of a standing semiconductor thin plate, and
wherein a voltage used to reduce a threshold voltage is input to the gate which controls the threshold voltage of the selection transistor during a writing operation than during a reading operation,
wherein the gate which controls the threshold voltage of the selection transistor is connected to wires arranged in a column direction parallel with a bit line; and
wherein the SRAM cell comprises a first half cell and a second half cell,
each half cell comprising an inverter and a selection transistor,
the inverter comprising a first transistor having a first conductivity channel and a second transistor having a second conductivity channel,
the inverter working as a component of a flip-flop together with an inverter in the counter-part half cell,
the selection transistor in the half cell comprising the four-terminal double gate field effect transistor,
a source, a drain, and a gate of the first transistor and a source, a drain, and a gate of the second transistor in the inverter being configured side-by-side, respectively,
a contact to the gate of the first transistor and a contact to the gate of the second transistor being collectively implemented by a single contact being configured between the first and the second transistors,
each four-terminal double gate field effect transistor comprising a standing semiconductor thin plate being aligned on the straight line running on the source and the drain of the first transistor in each inverter in each half cell,
the drain of the first transistor in each inverter being connected to the standing semiconductor thin plate of the four-terminal double gate field effect transistor in each half cell via a single contact,
the first gate of the four-terminal double gate field effect transistor which drives its selection operation being formed on the surface of the standing semiconductor thin plate facing outside the cell,
the second gate of the four-terminal double gate field effect transistor which adjusts its threshold voltage being formed on the surface of the standing semiconductor thin plate facing on the side where the gate contact for the input of the inverter is configured in reference to the line running on the standing semiconductor thin plane,
the wire which distributes the bias voltage which adjusts threshold voltage being implemented in parallel with a bit line,
the first half cell and the second half cell being configured to be symmetrical about a point, and
the contact to the first gate of the four-terminal double gate field effect transistor being implemented on the boundary of a neighbor memory cell.

2. The SRAM device according to claim 1,
wherein a potential lower than a ground potential of a cell is input to a word line when the word line is not selected.

3. The SRAM device according to claim 1,
wherein the SRAM cell comprises a first half cell and a second half cell,
each half cell comprising an inverter and a selection transistor,
the inverter comprising a first transistor having a first conductivity channel and a second transistor having a second conductivity channel,
the inverter working as a component of a flip-flop together with an inverter in the counter-part half cell,
the selection transistor in the half cell comprising the four-terminal double gate field effect transistor,
a source, a drain, and a gate of the first transistor and a source, a drain, and a gate of the second transistor in the inverter being configured side-by-side, respectively,
a contact to the gate of the first transistor and a contact to the gate of the second transistor being collectively implemented by a single contact being configured between the first and the second transistors,
each four-terminal double gate field effect transistor comprising a standing semiconductor thin plate being aligned on the straight line running on the source and the drain of the first transistor in each inverter in each half cell,
the drain of the first transistor in each inverter being connected to the standing semiconductor thin plate of the four-terminal double gate field effect transistor in each half cell via a single contact,
the first gate of the four-terminal double gate field effect transistor which drives its selection operation being formed on the surface of the standing semiconductor thin plate facing outside the cell,
the second gate of the four-terminal double gate field effect transistor which adjusts its threshold voltage being formed on the surface of the standing semiconductor thin plate facing on the side where the gate contact for the input of the inverter is configured in reference to the line running on the standing semiconductor thin plane,
the wire which distributes the bias voltage which adjusts threshold voltage being implemented in parallel with a bit line,
the first half cell and the second half cell being configured to be symmetrical about a point,
the contact to the first gate of the four-terminal double gate field effect transistor being implemented on the boundary of a neighbor memory cell, and
wherein a potential lower than a ground potential of a cell is input to a word line when the word line is not selected.

4. The SRAM device according to claim 1, further comprising, on each column, a circuit which calculates the logical product of a write enable signal and a column selection signal which is output from a column decoder, and generates a bias voltage according to the result.

5. The SRAM device according to claim 1,
wherein a signal potential of a word line is adjusted so as to reduce a current leakage which flows through a bit line in a cell belonging to a row without being selected.

6. The SRAM device according to claim 5, further comprising, on each row, a circuit which determines the signal potential suitable to an operation of a corresponding row on the basis of a row selection signal of a row decoder, and outputs the signal potential to a word line.

7. The SRAM device according to claim 2, further comprising, on each column, a circuit which calculates the logical product of a write enable signal and a column selection signal which is output from a column decoder, and generates a bias voltage according to the result.

8. The SRAM device according to claim 2,
wherein a signal potential of a word line is adjusted so as to reduce a current leakage which flows through a bit line in a cell belonging to a row without being selected.

9. The SRAM device according to claim 8, further comprising, on each row, a circuit which determines the signal potential suitable to an operation of a corresponding row on the basis of a row selection signal of a row decoder, and outputs the signal potential to a word line.

10. An SRAM device using a four-terminal double gate field effect transistor as a selection transistor,
wherein the four-terminal double gate field effect transistor comprises a gate which drives the transistor and a gate which controls a threshold voltage, which are electrically separated from each other, on both surfaces of a standing semiconductor thin plate, and
wherein a voltage used to reduce a threshold voltage is input to the gate which controls the threshold voltage of the selection transistor during a writing operation than during a reading operation,
wherein the gate which controls the threshold voltage of the selection transistor is connected to wires arranged in a column direction parallel with a bit line; and
wherein the SRAM cell comprises a first half cell and a second half cell,
each half cell comprising an inverter and a selection transistor,
the inverter comprising a first transistor having a first conductivity channel and a second transistor having a second conductivity channel,
the inverter working as a component of a flip-flop together with an inverter in the counter-part half cell,
the selection transistor in the half cell comprising the four-terminal double gate field effect transistor,
a source, a drain, and a gate of the first transistor and a source, a drain, and a gate of the second transistor in the inverter being configured side-by-side, respectively,
a contact to the gate of the first transistor and a contact to the gate of the second transistor being collectively implemented by a single contact being configured between the first and the second transistors,
each four-terminal double gate field effect transistor comprising a standing semiconductor thin plate being aligned on the straight line running on the source and the drain of the first transistor in each inverter in each half cell,
the drain of the first transistor in each inverter being connected to the standing semiconductor thin plate of the four-terminal double gate field effect transistor in each half cell via a single contact,
the first gate of the four-terminal double gate field effect transistor which drives its selection operation being formed on the surface of the standing semiconductor thin plate facing outside the cell,
the second gate of the four-terminal double gate field effect transistor which adjusts its threshold voltage being formed on the surface of the standing semiconductor thin plate facing on the side where the gate contact for the input of the inverter is configured in reference to the line running on the standing semiconductor thin plane,
the wire which distributes the bias voltage which adjusts threshold voltage being implemented in parallel with a bit line,
the first half cell and the second half cell being configured to be symmetrical about a point,
the contact to the first gate of the four-terminal double gate field effect transistor being implemented on the boundary of a neighbor memory cell, and
wherein a potential lower than a ground potential of a cell is input to a word line when the word line is not selected.

11. The SRAM device according to claim 10, further comprising, on each column, a circuit which calculates the logical product of a write enable signal and a column selection signal which is output from a column decoder, and generates a bias voltage according to the result.

12. The SRAM device according to claim 10,
wherein a signal potential of a word line is adjusted so as to reduce a current leakage which flows through a bit line in a cell belonging to a row without being selected.

13. The SRAM device according to claim 12, further comprising, on each row, a circuit which determines the signal potential suitable to an operation of a corresponding row on the basis of a row selection signal of a row decoder, and outputs the signal potential to a word line.

* * * * *